United States Patent [19]
Tursky et al.

[11] 4,135,291
[45] Jan. 23, 1979

[54] METHOD FOR PRODUCING SEMICONDUCTOR DEVICES WITH HIGH REVERSE BLOCKING CAPABILITY

[75] Inventors: Werner Tursky, Schwabach, Eichvasen; Madan Chadda, Nüremberg-Gaulnhofen; Horst Schäfer, Zirndorf, all of Fed. Rep. of Germany

[73] Assignee: Semikron, Gesellschaft für Gleichrichterbau und Elektronik m.b.H., Nüremberg, Fed. Rep. of Germany

[21] Appl. No.: 818,964

[22] Filed: Jul. 25, 1977

[30] Foreign Application Priority Data

Jul. 24, 1976 [DE] Fed. Rep. of Germany ....... 2633324

[51] Int. Cl.² ............................................. B01J 17/00
[52] U.S. Cl. ........................................ 29/574; 29/580; 29/583
[58] Field of Search .......................... 29/574, 580, 583

[56] References Cited

U.S. PATENT DOCUMENTS

| 3,121,279 | 2/1964 | Van Hoof | 29/576 S |
| 3,608,186 | 9/1971 | Hutson | 29/583 |
| 3,879,839 | 4/1975 | Logue | 29/574 |

*Primary Examiner*—W. Tupman
*Attorney, Agent, or Firm*—Spencer & Kaye

[57] ABSTRACT

A method of producing semiconductor devices having high reverse blocking capability comprising initially forming grooves in at least one major surface of a semiconductor disc of a first conductivity type according to a pattern which subdivides the disc into areal sections capable of being separated into individual device-containing semiconductor wafers and then subjecting the disc to a diffusion process to provide in each section a sequence of layer type zones of different conductivities which form at least one pn-junction and with one of the layer zones being a highly resistive zone, and to provide a zone of single conductivity type passing through the entire disc in the profile region of each of the grooves. A recess is then formed in each section of the major surface which is adjacent the pn-junction which is to be stressed in the reverse direction during use of the intended device and adjacent to each of the grooves. The recess extends from the major surface through the surface zone forming a pn-junction with the highly resistive zone into the highly resistive zone. Thereafter at least the surface of the disc containing the recesses is subjected to passivation by covering same with an insulating and stabilizing substance, the sections of the disc are provided with the necessary electrical contacts for the intended semiconductive devices, the devices formed in the individual sections are electrically tested, and finally the disc is separated along the grooves into individual semiconductor wafers.

18 Claims, 9 Drawing Figures

METHOD FOR PRODUCING SEMICONDUCTOR DEVICES WITH HIGH REVERSE BLOCKING CAPABILITY

BACKGROUND OF THE INVENTION

In order to produce semiconductor devices which are capable of operational reverse blocking voltages of 1000 volts or more, it is known to design the generated surface of a substantially wafer-shaped semiconductor body having a plurality of layer-type zones of different conductivity types so that, at least in the region where the pn-junction exits, it is frustoconical in a certain orientation. For example, in a four-layer structure for controllable semiconductor rectifiers, the generated or edge surface has a so-called double facet with two successive slopes which are each slanted in the same direction but with a different pitch. It is known that reverse blocking voltage capability increases with increase in the pitch of the slope. Such shapes are usually attained by grinding, sand-blasting or etching or a combination of these methods. These process steps required to achieve this partially require the treatment of the individual semiconductor devices, which is highly expensive and often results in undue spread of the characteristic values of these individual semiconductor devices.

A more economical production of semiconductor devices of high reverse blocking capability has been achieved by performing the process steps required for treating the semiconductor body of the individual devices while they form part of a large-area basic disc, i.e., before the individual semiconductor bodies are separated from the disc. In this manner it is possible to simultaneously make the economical application of each of the various distinct processes to a large number of such semiconductor bodies, hereinafter called semiconductor wafers, under the same process conditions. One process has been suggested in which a basic semiconductor disc, hereinafter called disc, having a large surface, and usually a structure of at least three zones of different conductivity types with higher doping in the outer zones than in the center zone, is etched according to a given pattern to produce semiconductor wafers of a smaller areal expanse in the desired planar shape and with defined double facets for high reverse blocking voltage capability. Further treatment of the semiconductor wafers, such as covering the semiconductor surface in the region of the exit of the pn-junctions with a stabilizing protective lacquer to protect it against undesired contamination and its influence on the critical surface field intensity, as well as contacting, testing and other processes, is possible only on the individual wafers thus formed.

Another process is known in which three parallel grooves are formed in both major surfaces of a disc with the pattern of the three grooves on one major surface of the disc coinciding with the pattern of the three grooves on the opposite major surface of the disc. The middle groove of each of the three parallel grooves determines the separation of the semiconductor wafers. The outer grooves determine the function-dependent configuration of the semiconductor wafers and extend, for this purpose, from the surface through the adjacent pn-junction to the highly resistive center zone adjacent to that pn-junction. These grooves are made in the disc after the required doping processes have been accomplished. The disc is thus effectively subdivided into a plurality of bodies of a smaller areal expanse while, since the disc has not yet been broken up, still allowing further process steps to be simultaneously performed on all of the semiconductor wafers. Such a process sequence assures uniform quality of the resultant semiconductor wafers. The stabilization of the semiconductor surfaces must be effected in the outer grooves since a pn-junction comes to the surface in each of them. Passivation is effected by filling the grooves with a protective lacquer or with a glass-forming substance.

Although the above process substantially fulfills the requirements of more economic manufacture of semiconductor devices by simultaneously working a plurality of semiconductor wafers while they are connected together, it has its drawbacks. For example, it is necessary that individual process steps be effected on both sides of the disc which requires special measures. Moreover, the contact coatings on the side of the wafers on which the majority of the heat is dissipated from the semiconductor devices during use are limited by the application of the grooves and this limits the heat contact surfaces so that optimum heat dissipation cannot be attained. Furthermore, a minor voltage breakthrough resistance, due to the arrangement of grooves on both sides, is determined by the thickness of the center zone remaining between oppositely disposed grooves, which limits the expanse of the space charge zones, and thus the permissible reverse voltage when the appropriate voltage is applied. Finally, the reverse blocking voltage capability is reduced because the breakthrough resistance between the center zone and a connecting lead fastened to the semiconductor wafer is not sufficient at all points in the region of the grooves which is due to unavoidable differences in the thickness of the glass layer in the grooves.

SUMMARY OF THE INVENTION

The object of the present invention is to provide a process by which one can achieve the advantages of the sloped configuration to produce high reverse blocking capability of semiconductor wafers and the more economical manufacturing and processing of semiconductor wafers while they are still connected together in a disc, but in which the drawbacks of expensive treatments of individual wafers to produce highly blocking devices or to limit heat dissipation and reverse blocking capability inherent in the known mass production process are avoided.

The above object is achieved according to the present invention in that in a process for producing semiconductor devices of a high reverse blocking capability from a semiconductor disc of one conductivity type having a sequence and with the devices of at least three layer-type zones of different conductivity types with at least one of the zones being highly resistive and in which there is at least one pn-junction, the following steps are involved: producing grooves in at least one major surface of said disc to subdivide the disc into sections of smaller areal extent said grooves having a depth at least equal to the thickness of said highly resistive zone; subjecting the grooved disc to a diffusion process to provide, in each section, a sequence of layer-type zones of different conductivity types with one of said zones being highly resistive and forming at least one pn-junction and, further, to provide a zone of single conductivity type which extends entirely through the disc in the profile region of each groove; forming a recess in each section of the disc and adjacent to each groove with the recess extending from the major surface of the disc which is adjacent the pn-junction which will be stressed in the reverse direction during use of the intended semiconductor devices through the surface zone forming the pn-junction with the highly resistive zone and into the highly resistive zone; and then passivating the surfaces of the formed recesses, providing contacts for the devices in the individual sections, electrically testing the individual devices in the respective sections, and finally separating the disc into the individual wafers.

BRIEF DESCRIPTION OF THE DRAWINGS

Like parts have the same number in all of the figures.

DETAILED DESCRIPTION OF THE INVENTION

Figure 1:
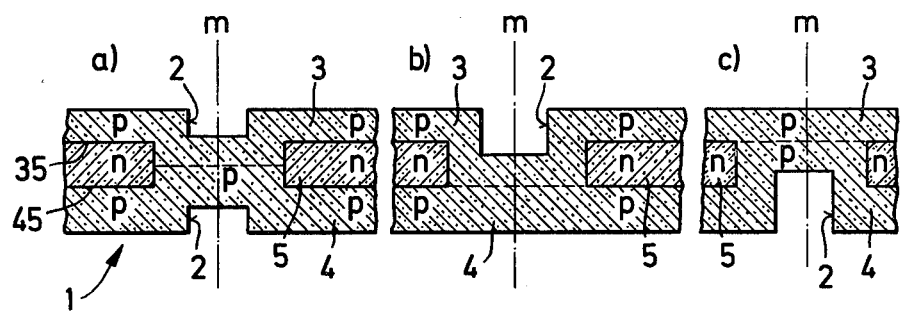
FIG. 1 is a cross-sectional view of portions of a disc showing various patterns of grooves subdividing the discs according to a feature of the invention.

In order to produce a structure according to FIG. 1, a semiconductive disc 1 of one conductivity type, such as, for example, an n-conductive disc in the illustrated embodiment, is provided on one or both of its major surfaces with grooves 2 according to a desired pattern to subdivide the disc into smaller areal sections capable of being separated into individual semiconductor wafers. The pattern may, for example, be a grid pattern, to produce rectangular semiconductor wafers. The grooves can be formed by etching, ultrasonic drilling or sawing, for example, by means of grinding devices. As discussed herein below, the grooves 2 serve during the diffusion process to enable the formation of a continuous highly doped region between the two major surfaces of the wafer for the mutual electrical isolation of adjacent semiconductor wafers while the wafers are still connected in the disc. Grooves 2 thus define the path (lines m) for the separation of the disc into the individual semiconductor wafers.

The width of the grooves 2 is not critical. It is determined by the requirement for the least possible loss of material during separation and by the most favorable separation method used in the manufacturing process. The depth of the grooves is determined, according to the present invention, to be sufficient so that during the subsequent diffusion process, for example, to produce a pnp zone sequence, the two p-conductive zones 3 and 4 which are formed abut in the interior of the disc and form a continuous highly doped single conductivity type region, i.e., p-type conductivity in the illustrated embodiment, in the portion of the disc volume in the profile region of the grooves due to the penetration depth of the p-conductive zones to thereby effect a short circuit between adjacent semiconductor wafers in the zone sequence. Within this continuous region the individual device containing wafers will be electrically separated from one another. To achieve this result, the depth of grooves 2, when they are arranged on only one major side of the disc, must be at least equal to the desired thickness of the center, highly resistive n-conductivity type zone 5. If the grooves are arranged on both major sides of the disc, either oppositely to one another or offset with respect to one another, the combined depth of the grooves on both major sides must be at least equal to the desired thickness of the n-conductivity type zone.

The disc of n-conductivity type which has been provided with grooves 2 is then subjected to a conventional diffusion process from both surfaces to produce zones 3 and 4 of the opposite conductivity type, i.e., p-type in the illustrated embodiment. Any conventional diffusion process, which uses a doping agent capable of forming p-conductivity type zones 3 and 4, can be used.

The configuration of the two p-conductive zones 3 and 4 in the region of the grooves 2 by doping of disc 1 from both major sides or surfaces for each of the three shown configurations for the grooves 2 is shown by the dashed lines in FIG. 1.

The mutual spacing of grooves 2 is determined substantially by the desired areal expanse of the intended semiconductor wafers plus sufficient additional areal expanse for the accommodation of contact electrodes and recesses as discussed hereinbelow.

After performing the first diffusion process to produce zones 3 and 4, the structure of the disc contains sections of larger areal expanse with a pnp zone sequence therein suitable for individual semiconductor devices which alternate with sections of smaller areal expanse having a continuous p-type conductivity.

As indicated above, the grooves 2 may be formed in both surfaces of the disc either opposite one another, as shown in FIG. 1 at (a), or only on one side, as shown in FIG. 1 at (b) and (c), or on both sides and offset with respect to one another according to a combination of the grooves shown at (b) and (c) of FIG. 1, or in any other desired arrangement. The grooves may also have any desired cross section which is determined only by the mode of fabrication.

In the respective disc section between adjacent grooves 2, the highly resistive inner n-conductive zone 5 is defined by a closed pn-junction surface S with, for example, a rectangular profile, which includes the longer pn-junction portions 35 and 45 formed between the zone 2 and the zones 3 and 4, respectively, as well as the shorter pn-junction portions formed between each n-conductive zone 5 and the continuous p-conductive zone. The two long pn-junction portions 35 and 45 constitute highly blocking pn-junction portions.

Figure 2:
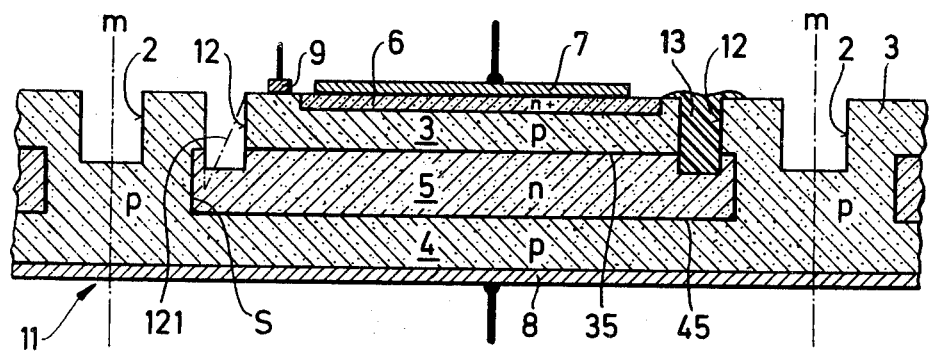
FIG. 2 is a cross-sectional view of a portion of a disc showing the grooves and the recesses and layer structure of the disc to form semiconductive wafers suitable for thyristor devices according to the invention.

In order to produce a semiconductor body for operational semiconductor devices from such a structure, the pn-junction surface S, as shown in FIG. 2, must be interrupted to form the known structure 11 of a semiconductor body suitable for a thyristor. The separation of the closed pn-junction surface S is effected according to the invention by the formation of recesses 12 in a major surface of the disc, with one such recess being formed in each areal section.

Corresponding to the explanations in connection with FIG. 1, the present invention provides that, in order to form the arrangement shown in FIG. 2, grooves 2 are initially formed in the major surface of an n-conductive disc 1. Then a pnp-zone sequence with zones 3, 4, 5, as shown in FIG. 2, is produced in a conventional first diffusion process simultaneously in all of the areal sections of the disc outlined by grooves 2. Thereafter, in a conventional second diffusion process, including any necessary masking, a highly doped outer zone 6 of the first conductivity type, n+ conductivity in the illustrated embodiment, is produced in all zone sequences to serve as the emitter zone of the thyristor. The present invention requires that recesses 12 be formed in only that disc surface which is adjacent to the pn-junction to be charged with the reverse voltage during use of the intended semiconductor wafer and that the recess in each areal section extends through the surface zone forming the pn-junction with the highly resistive center zone 5 (in the illustrated embodiment the zone 3), thus separating the closed junction surface S into two separate pn-junctions. The recess 12 is formed in each areal section adjacent the grooves 2 defining same. Although in the cross-sectional view shown the recess 12 separates the junction surface at two points, it is to be understood that the recess 12, as seen from the major surface, is actually closed on itself, e.g., has a rectangular or annular shape. According to the illustration of FIG. 2, the recess 12 is provided in a structure having four zones of different conductivity types surrounding each zone 6, but leaving a surface region for a control electrode 9 for zone 3, so that the pn-junction to receive the blocking voltage is interrupted. It is known that thyristors must have a reverse voltage capability, when charged with a blocking voltage, which corresponds to that voltage present when charged with a reverse voltage.

In the illustrated structure, recesses 12 may also be applied from the other disc surface through pn-junction portion 45.

Figure 3:
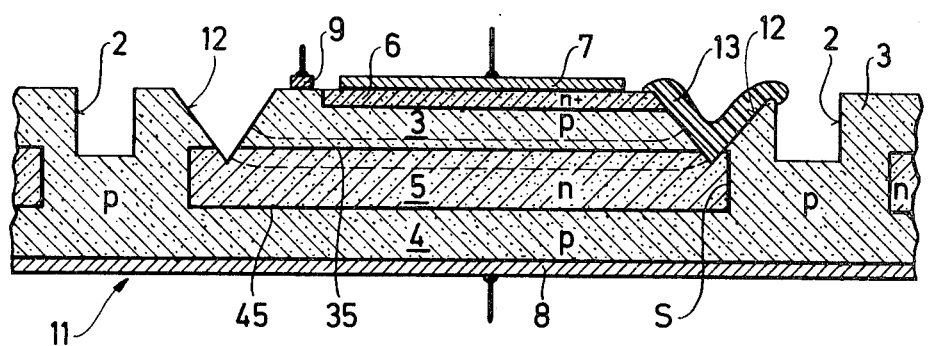
FIG. 3 is a cross-sectional view of a portion of a disc showing a modification of the arrangement of FIG. 2.

The position and shape of the recesses 12 are determined substantially by the requirement that the pn-junctions coming to the surface within recesses 12 must exit at as great a mutual distance as possible in order to assure the highest possible critical surface field intensity in this region. An arrangement of recesses 12 such that the vertical side surface of the recess closest to the adjacent groove 2 no longer contacts pn-junction 35 but, instead, extends entirely in the adjacent separating region between the zone sequences meets the requirement for economic production of semiconductor devices, but does not meet the requirement for optimization of the reverse voltage capability. The position of the recesses 12, on the other hand, is also determined by the requirement for the best possible utilization of the area between grooves 2. If it is assumed, for example, that the depth of the p-conductive zone 3 is about 70μ, then the horizontal distance between the side wall of one groove 2 and the adjacent vertical section of the pn-junction surface S is also about 70μ so that the distance between one groove and the adjacent recess 12 may be, for example, 100μ. The shape of recesses 12 is furthermore determined substantially by the desired reverse voltage capability of the intended semiconductor devices. If recesses 12 are designed, for example, as shown in FIG. 2 in a rectangular shape, the highest permissible reverse voltage will not reach the intended range as known with semiconductor wafers having cylindrical generated surfaces. If, however, the recesses are designed in a wedge shape, for example, as shown in FIG. 3, the slope of the resulting surface in the region where the pn-junction exits produces a correspondingly higher reverse voltage capability. The smaller the angle between the side of recess 12 associated with the emitter zone 6 and the pn-junction surface, the higher is the blocking capability in the reverse direction. Recesses 12 may also be designed to have only a single sloped side wall 121 only on the side where the pn-junction 35 exits, as is also shown by dashed lines in FIG. 2.

Recesses 12 simultaneously serve to directly provide passivation of the wafers, i.e., for the application of a protective and stabilizing coating on the semiconductor surface in the region of the exit of the pn-junction or junctions, when they are filled with conventional protective lacquers or glass-forming substances 13 for this purpose.

Either before or after the process step of the passivation, the structure is provided, by conventional techniques, with a continuous contact metal coating 8 for the zone 4 of the entire disc and with a respective metallization 7 to contact each emitter zone 6 of the disc 11, as well as with a respective control electrode 9 for each zone 3 of the disc 11.

The disc 11 treated in this manner thus has a plurality of wafers each including an operational thyristor, which are still connected together by means of the respective continuous p-zones, and based on the unilateral application of recesses 12, they can be surprisingly economically subjected to the further process steps of passivation, testing, contacting with contact members, and encapsulation, if required, or separation from the interconnections in the disc.

The process for producing the structure according to FIG. 2 can also be effected by forming the grooves 2 prior to the first diffusion step to produce the pnp zone sequence and by forming only the recesses 12 after the first diffusion process and, thereafter, effecting the second diffusion step to produce the emitter zones 6. In this process sequence, the recesses 12 must be masked and can simultaneously be provided with the protective coating to passivate the semiconductor surface in the same process step. In this case, the additional step of passivation is eliminated. The protective coating in this case is a glass which is produced by oxidation of the semiconductor surface during the heating of said surface for said second diffusion step. The thickness of the glass coating may be increased by the respective extension of the heating period at a temperature below that for the diffusion process, for example 900° to 1000° C.

The structure shown in FIG. 3 corresponds to that of FIG. 2, except that the recesses 12 are wedge-shaped in order to improve the blocking capability. Moreover, lines of constant voltage are produced in zones 3 and 5 adjacent the blocking junction 35 as shown in dashed lines when a voltage is applied across electrodes 7 and 8 with a polarity in the forward direction. The spread of these lines, which correspond to the curve of the space charge zones, can be seen in the region of the exit into the recesses 12.

Recesses 12 may be produced, for example, by etching or ultrasonic drilling. If an etching process is employed, a defined profile of the recesses for high blocking capability of the semiconductor wafers can be realized by utilization of the fact that the removal of semiconductor material is more intensive the higher the degree of its doping with donor impurity material. For this purpose, emitter zone 6 is formed with the maximum possible areal expanse and, in order to be able to remove material at the corresponding points in the mask, openings are provided to facilitate a defined attack of the etching medium.

Figure 4:
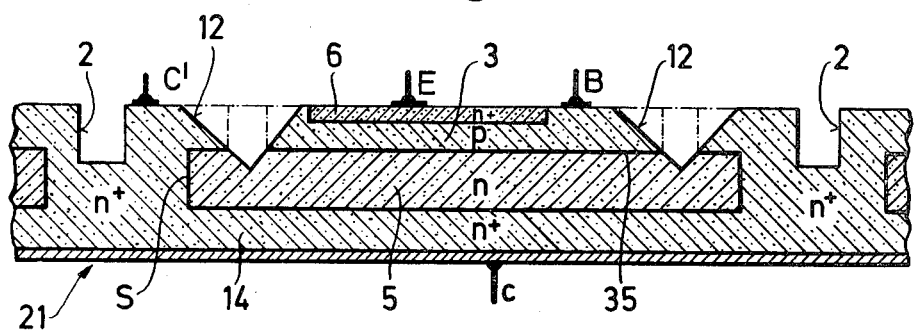
FIG. 4 is a cross-sectional view of a portion of a disc showing one embodiment of the grooves, recesses and layer structure for the production of individual semiconductor wafers containing transistors according to the present invention.

Finally, FIG. 4 shows the use of the present invention for the production of transistors, and in particular, highly blocking transistors which are increasingly being used for power control and as switches for high power applications due to their high switching speed. According to the invention, disc 21 is initially provided with grooves 2. Then, in several diffusion processes, and with suitable masking on the surface of the wafers containing the grooves 2, an n+ conductive zone 14 is formed on the continuous side of the disc which will not be further processed, so as to provide a good contact for the highly resistive center zone 5, with this n+ conductive zone 14 further serving to form a short-circuiting region between the two major surfaces of the disc in the profile region of groove 2 and enclosing both ends of the highly resistive zone 5. The opposite side of disc 21 is then masked in a known suitable manner to enable one to produce a p-conductive zone 3 of a defined areal expanse within the n-conductive material by a diffusion process and, finally, to produce a highly doped n-conductive zone 6, which serves as the emitter in the zone 3. The zone sequence produced by the diffusion on the major side of disc 21 which has been provided with grooves 2 for a given wafer is shown in dashed lines, i.e., the pn-junction between zones 3 and 5 as well as the interface between zones 5 and 14 extend to the same major surface containing the grooves 2. Following this process step, recesses 12, which are preferably wedge shaped as shown, are applied so that the highly blocking pn-junction 35 no longer exits at the major surface of disc 21 but at the surface within recesses 12 and can be readily passivated.

The structure of FIG. 4 produced in this manner corresponds to that of FIG. 3, except for the sequence of the conductivity type zones, and can be contacted in the same manner as a thyristor wafer, i.e., with a collector terminal C for the zone 14, an emitter terminal E for the zone 6 and a base terminal B for the zone 5. The process according to the invention, on the other hand, also permits the advantageous complete contacting of all of the zones from one major surface of the disc or wafers. That is, the collector zone 14 may be provided with a collector terminal C', in the manner used for contacting so-called buried layers in the planar technique, on the portion of the n+ conductive zone 14 which extends to the major surface bearing the grooves 2 between each groove 2 and a recess 12. In this embodiment as well, the above explained slope of recesses 12 determines the reverse voltage capability of the transistor.

It is understood that the process according to the invention can also be used to produce semiconductor wafers having a zone sequence with a sequence of conductivity types which is opposite to that shown in the drawings. Moreover, the process according to the invention can also be used to produce highly blocking diodes if in the structure according to FIG. 4 the highly doped zone 6 and the contact E are eliminated so that an $n^{30}$ np structure with two terminals B and C or C' is produced.

The advantages of the process according to the invention are that after production of a zone sequence in a disc, all process steps required to form and fabricate the device containing individual semiconductor wafers can be performed from or on only one major surface of the disc and can be effected, if required, before the semiconductor wafers are installed in a housing; that a particularly simple design of the semiconductor surface in the region of the exit of the pn-junction, as it can be realized from one side, permits the attainment of optimum reverse blocking voltage capability, with passivation of the semiconductor surface being possible simultaneously in an advantageous manner; and that all types of semiconductor devices having a high reverse blocking capability can be produced in the same manner under optimum economic conditions.

It will be understood that the above description of the present invention is susceptible to various modifications, changes and adaptations and the same are intended to be comprehended within the meaning and range of equivalents of the appended claims.

What is claimed is:

1. A method for producing a plurality of semiconductor devices out of a semiconductor disc of a first conductivity type with the devices having a high reverse blocking capability and having a sequence of at least three layer-type zones of different conductivity types, of which at least one is highly resistive, and at least one pn-junction, comprising the steps of:

forming grooves of a depth at least equal to the desired thickness of the highly resistive zone in at least one of the major surfaces of said disc according to a desired pattern to subdivide said disc into sections of smaller areal expanse capable of being separated into individual semiconductor device containing wafers;

thereafter subjecting the disc to a diffusion process to produce a sequence of at least three layer-type zones of different conductivity which form at least one pn-junction in each said section, and a zone of a single conductivity type which passes through the entire disc in the profile region of each of the grooves, said region defining the lateral boundaries of the pn-junctions;

in each said section and adjacent the associated groove, forming a closed recess in the major surface of the disc which is adjacent to the pn-junction which would be stressed in the reverse direction during use of the semiconductor device being produced, with said recess extending through the zone which is adjacent said major surface and forms a pn-junction with said highly resistive zone and into said highly resistive zone;

subjecting at least the surfaces of said recesses to passivation by covering same with an insulating and stabilizing substance;

providing electrical contacts for the devices formed in said sections of said disc;

electrically testing the devices formed in said sections; and thereafter separating said disc along said grooves into individual semiconductor wafers.

2. The method defined in claim 1 wherein said step of subjecting said disc to a diffusion process includes diffusing an impurity which forms a zone of the opposite conductivity type into both major surfaces of said disc to provide, in each said section, a sequence of three layer-type zones of alternating conductivity types with the zones adjacent both major surfaces being of said opposite conductivity type and an inner zone of said first conductivity type, and to provide a zone of said opposite conuctivity type which passes entirely through said disc in the profile region of said grooves.

3. The method defined in claim 2 further comprising subjecting said major surface containing said recesses to a further diffusion process to form a highly doped zone of said first conductivity type within the adjacent opposite conductivity type zone to produce a sequence of four zones of alternatingly opposite conductivity types within each section of said disc.

4. The method defined in claim 1 wherein said step of subjecting said disc to a diffusion process includes diffusing impurities into said major surfaces of said disc to form a highly doped zone of said first conductivity type adjacent one major surface and a zone of the opposite conductivity type adjacent the major surface containing said recesses so as to provide a sequence of a highly doped zone of a first conductivity type, a lowly doped zone of said first conductivity type and a zone of said opposite conductivity type within each said section, and to form a highly doped zone of said first conductivity type which extends entirely through said disc in the profile region of each of said grooves.

5. The method defined in claim 4 further comprising subjecting said major surface containing said recesses to a further diffusion process to form a highly doped zone of said first conductivity type within said opposite conductivity type zone and adjacent said major surface in each of said sections.

6. The method defined in claim 1 further comprising filling said recesses with an insulating and stabilizing substance.

7. The method defined in claim 3 further comprising filling the recesses with an insulating and stabilizing substance subsequent to said further diffusion process to form the highly doped first conductivity type zone.

8. The method defined in claim 5 further comprising filling said recesses with an insulating and stabilizing substance subsequent to said further diffusion process to form the highly doped first conductivity type zone within said opposite conductivity type zone.

9. The method defined in claim 3 further comprising, prior to said step of subjecting said disc to a further diffusion process, filling said recesses with an insulating and stabilizing substance which simultaneously serves as a mask for the recess surfaces during said further diffusion process in order to avoid further undesirable diffusion phenomena at the recess surfaces.

10. The method defined in claim 5 further comprising, prior to said step of subjecting said disc to a further diffusion process, filling said recesses with an insulating and stabilizing substance which simultaneously serves as a mask for the recess surfaces during said further diffusion process in order to avoid further undesirable diffusion phenomena at the recess surfaces.

11. The method defined in claim 9 wherein the insulating and stabilizing substance used to passivate the semiconductor surfaces is a protective lacquer containing agents which produce chemical bonds with the impurities used during the diffusion process.

12. The method defined in claim 10 wherein the insulating and stabilizing substance used to passivate the semiconductor surfaces is a protective lacquer containing agents which produce chemical bonds with the impurities used during the diffusion process.

13. The method defined in claim 1 wherein the insulating and stabilizing substance used to passivate the semiconductor surfaces is a glass forming compound.

14. The method defined in claim 1 wherein the grooves are formed in only one of the major surfaces of the disc.

15. The method defined in claim 1 wherein the grooves are formed in both major surfaces of the disc with the grooves in both major surfaces being in mutual coincidence with each other.

16. The method defined in claim 1 wherein the grooves are formed in both major surfaces of the disc with the grooves in one of the major surfaces being offset with respect to the grooves in the other major surface.

17. The method defined in claim 1 wherein the recesses are wedge shaped with sloping side surfaces.

18. The method defined in claim 1 wherein each of said recesses is wedge shaped with at least the side surface of the recess at which said pn-junction exits being inclined toward the central region of the areal section of the associated major surface.

* * * * *